(12) United States Patent
Eussen

(10) Patent No.: US 7,505,113 B2
(45) Date of Patent: Mar. 17, 2009

(54) LITHOGRAPHIC APPARATUS AND DEVICE MANUFACTURING METHOD

(75) Inventor: Emiel Jozef Melanie Eussen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 408 days.

(21) Appl. No.: 11/236,864

(22) Filed: Sep. 28, 2005

(65) Prior Publication Data
US 2007/0070313 A1    Mar. 29, 2007

(51) Int. Cl.
  G03B 27/42    (2006.01)
  G03B 27/58    (2006.01)
  G03B 27/62    (2006.01)
(52) U.S. Cl. .............................. 355/53; 355/72; 355/75; 355/77
(58) Field of Classification Search .................... 355/53, 355/72, 75, 52, 55, 67, 69; 356/399, 400, 356/401, 500
See application file for complete search history.

(56) References Cited

U.S. PATENT DOCUMENTS

| | | | | |
|---|---|---|---|---|
| 4,984,891 A | * | 1/1991 | Miyazaki et al. ............ | 356/500 |
| 7,307,692 B2 | * | 12/2007 | Korenaga et al. ............ | 355/55 |
| 2004/0105085 A1 | * | 6/2004 | Suzuki ........................ | 355/69 |
| 2004/0135980 A1 | * | 7/2004 | Hill .............................. | 355/52 |

* cited by examiner

Primary Examiner—Peter B Kim
(74) Attorney, Agent, or Firm—Pillsbury Winthrop Shaw Pittman LLP

(57) ABSTRACT

A lithographic apparatus including a projection system configured to project a patterned radiation beam onto a target portion of a substrate includes a position measuring system configured to determine the position of a movable object in at least one direction. The measuring system includes at least a first sensor arranged spaced from one side of the object and at least a second sensor arranged spaced from an opposite side of the movable object, and a calculation device configured to calculate the position of the object on the basis of distances measured by the first sensor and the second sensor between the first and the object and the second sensor and the object, respectively. By using the (weighted) difference between measured signals for calculation of the position of the object, the errors in the sensor signals caused by disturbances, such as global and/or local changes of the refractive index and expansion can be substantially reduced.

9 Claims, 5 Drawing Sheets

LITHOGRAPHIC APPARATUS AND DEVICE MANUFACTURING METHOD

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus a position measurement system is used, to determine the position of movable objects such as a substrate table and a patterning device support. The position measurement for the mask and substrate tables has to be performed in all 6 DOF to sub-nanometer resolution, with nanometer accuracy and stability. This is commonly achieved using (single or multi-axis) interferometers to measure displacements in all 6 DOF, with the possibility of redundant axes for additional calibration functions (e.g. calibrations of interferometer mirror flatness on the substrate table).

The performance of an interferometer is generally dependent on the beam length, since the optical pathlength is sensitive to refractive index changes caused by global and/or local environmental changes. Therefore performance of interferometers tends to decrease if beam lengths get longer. The effect of these changes on the performance of the interferometer start to become significant at the accuracy levels required in lithographic devices.

For instance typical problems are noticed due to periodic (high frequent) pressure changes in the environment. These pressure changes have a significant influence on the refractive index of the medium through which the measurement signal goes. It is remarked that it is known to use pressure sensors in order to take these pressure changes into account. However, these pressure sensors are typically too slow to deal with the disturbances. At present no other solution is proven to adequately correct for these pressure changes. Also other environmental factors such as temperature changes, air composition (amount CO2) and such have an influence on the performance of interferometers.

Furthermore, thermal expansion effects of the frame on which the interferometers are arranged, and the substrate table itself, will cause changes in the beam length (physical change of beam path). By requiring (extremely) high specifications on the conditioning of both the environment in which the optical signal of the interferometers travels, and the mechanics that are involved in the measurement loop, these thermal expansion effects can be reduced.

SUMMARY

It is desirable to provide a lithographic apparatus having a high accuracy position measurement system for a movable object which is less sensitive for disturbances of the signal of the sensors of the position measurement system.

According to an embodiment of the invention, there is provided a lithographic apparatus includes a projection system configured to project a patterned radiation beam onto a target portion of the substrate, wherein said lithographic apparatus includes a position measuring system configured to determine the position of a movable object in at least one direction, said position measuring system comprising at least a first sensor being arranged spaced from one side of said movable object and at least a second sensor being arranged spaced from an opposite side of said movable object, and a calculation device configured to calculate the position of said movable object in said direction on the basis of distances measured by said first sensor and said second sensor.

According to an embodiment of the invention, there is provided a device manufacturing method includes transferring a pattern from a patterning device onto a substrate, wherein a position of a movable object in a direction is determined by using a position measuring system comprising at least a first sensor arranged spaced from one side of said movable object and at least a second sensor arranged spaced from an opposite side of said movable object, comprising the steps measuring with said first sensor a first measured distance between said movable object and said first sensor, measuring with said second sensor a second measured distance between said movable object and said second sensor, and calculating a calculated position of said movable object in said direction on the basis of said first and second measured distances.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
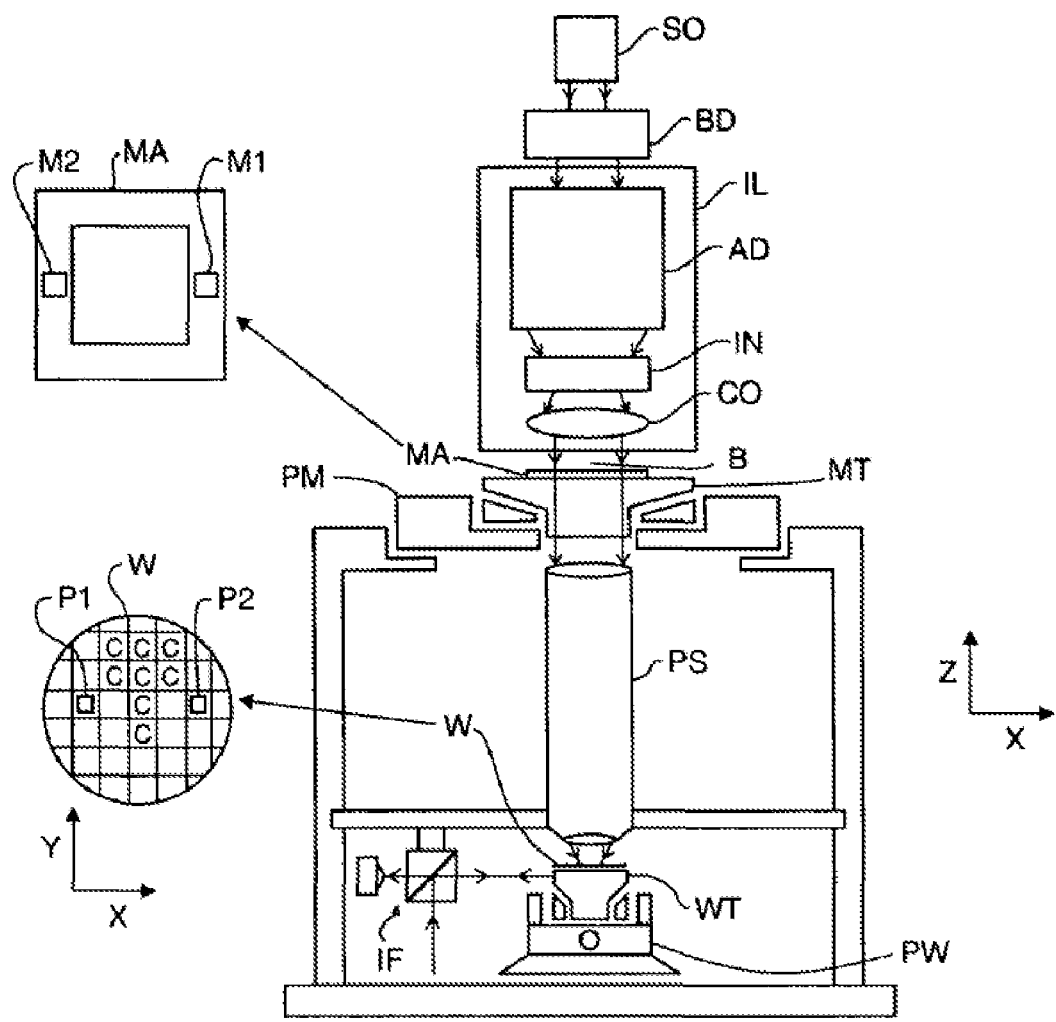
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
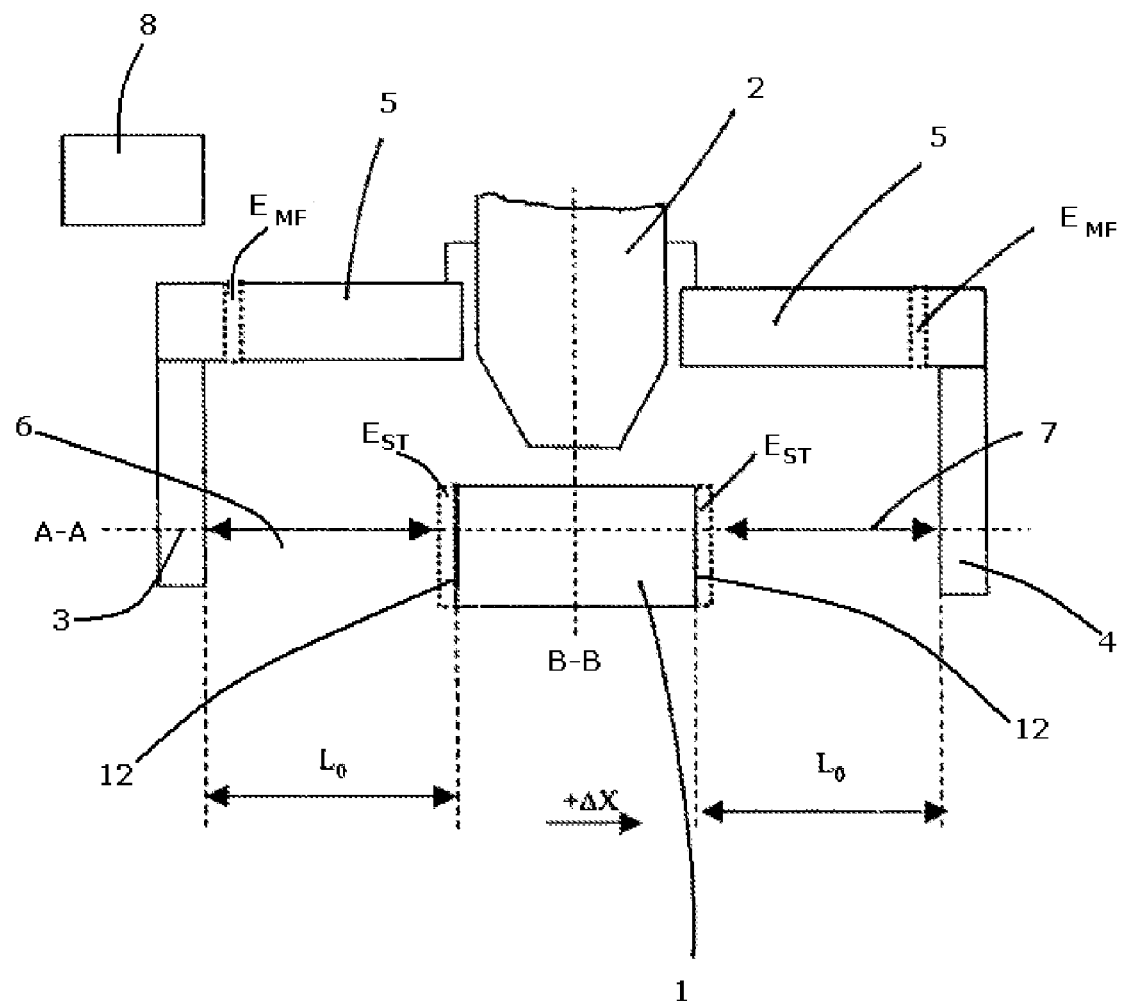
FIG. 2 depicts a position measuring system according to an embodiment of the invention.

FIG. 2 shows a part of a lithographic apparatus comprising a first embodiment of a position measurement system according to the present invention. A substrate table 1 is placed under a lens column 2. An interferometer 3 is placed on one side of the substrate table 1. The interferometer 3 is configured to measure the distance between the substrate table 1 and the interferometer 3 in a direction, in particular on a measurement line A-A. The interferometer 3 is substantially arranged on this measurement line A-A, i.e. the optical signal 6 of the interferometer 3 will substantially travel along this measurement axis A-A. It will be clear that the direction in which the distance between the interferometer 3 and the substrate table 1 is measured corresponds with the direction of the measurement line A-A.

It is remarked that the "measured distance" as used in this application refers to the signal provided by a sensor, in particular an interferometer, which signal is representative for the distance between the movable object, in the present case the substrate table 1, and a reference point, in this case the interferometer 3. This signal may be the actual distance, the displacement, or a multiple thereof, or any other signal representative for the distance between the reference point and the movable object, or the displacement of the movable object itself. All these signals are regarded as "the measured distance" and are therefore deemed to fall within the scope of the present invention.

The interferometer 3 is mounted on a frame 5 which is thermally balanced, preferably substantially symmetrical with respect to the centerline B-B of the lens column. The substrate table 1 is at least movable in the direction of the measurement line A-A. In FIG. 2 the substrate table 1 is shown in its center position with respect to the lens column 2, i.e. the center of the substrate table 1 is located on the center line B-B of the lens column 2. The position measuring system further comprises a calculation device 8 in which the signals of the different interferometers are used to determine the position of the substrate table 1. This calculation device may be a single device or may be a part of the general control unit of the lithographic apparatus.

Interferometers use optical signals which are reflected on a reflective surface 12 of substrate table 1, to determine the position of the substrate table 1 with respect to the respective interferometer. Although in FIG. 2 only two interferometers 3, 4 are shown, a position measuring system based on interferometers will normally comprise at least six interferometers axes for measuring the position of a substrate table in six degrees of freedom as is known for the man skilled in the art. Furthermore, in the present embodiment the interferometers 3, 4 are mounted on a stationary object, for instance a frame, and the reflective surfaces 12 are mounted on the substrate table 1. In alternative embodiments, the sensors, in particular the interferometers, may be mounted on the substrate table (the movable object), and the reflective surfaces on the stationary object. Such embodiments are also regarded to fall within the scope of the present invention.

An interferometer may be used to determine the position of a movable object, in the present case the substrate table 1, on a sub-nanometer level which accuracy is needed in a state-of-the-art lithographic apparatus. However, the measurement of the interferometer may be disturbed by different parameters. This disturbance by a different parameters becomes in particular apparent on the high accuracy levels needed in a lithographic apparatus.

For instance, the thermal expansion of the frame 5 may enlarge (or decrease) the distance between the interferometer 3 and the substrate table 1. As a consequence for the interferometer 3 it seems that the substrate table has moved away. Also, the thermal expansion of the substrate table itself may have an influence on the position measured by the interferometer 3. When the substrate table 1 expands, the distance between the interferometer 3 and the substrate table 1 will decrease, without actually moving the substrate table 1. As a consequence, for the interferometer 3 it will seem that the substrate table 1 has moved towards the interferometer 3.

In the known lithographic apparatus, these effects have been taken into account by having very strict requirements on the conditioning of the space in which the interferometer 3 and the substrate table 1 are placed. By keeping these strict requirements, the expansion of both the frame 5 and the substrate table 1 is kept substantially the same during the lithographic process avoiding the above errors during measurement of position of the substrate table 1. However, such strict requirements on the conditioning are generally undesired.

Furthermore, changes in the refractive index of the gas/air through which the interferometer signal travels, may have an influence on the measurement of the interferometer 3. These changes in the refractive index may for instance be caused by changes in temperature, the pressure or the composition of the gas/air. The effect of changes in the refractive index may be global, i.e. all interferometer signals experience the same effect, or local, i.e. only certain interferometer signals experience a change of the refractive index. A global effect may for instance be a change in the overall (atmospheric) pressure of the gas/air of the measurement environment, while a local effect may be a local temperature change due to movement of the substrate table 1. It will be clear that an increasing length of a measurement beam of the interferometer will also have an increasing effect of the disturbance due to changes in the refractive index.

In the known lithographic apparatus, the changes in the refractive index have for instance been taken into account by measuring the temperature and/or pressure in the gas/air, and using this information in the calculation of the actual position of the substrate table 1. However, the measurements of such parameters, is typically too slow so that the possibilities for compensation of the changes in the refractive index are limited.

The present invention provides a second sensor, in particular an interferometer 4, which is arranged on an opposite side of said substrate table 1. The interferometer 4 is configured to measure the position of the substrate table 1 in the same direction as interferometer 3. The interferometer 4 is mounted on the frame 5 on a position substantially symmetrical with respect to the centerline B-B of the lens column 2. Furthermore, the interferometer 4 is arranged on the measurement line A-A, i.e. the optical signal 7 of the interferometer 4 travels substantially along the measurement line A-A.

The measurements of the two interferometers 3, 4 may be used to determine the position of the substrate table 1 in the direction of the measurement line A-A, whereby the influence of disturbances in the measurement signal, such as described above, may be decreased, as will be explained hereinafter The length measured by each of the interferometer 3, 4, respectively, may be written as:

$$l_1 = \Delta x + E + P \cdot (L_0 + \Delta x) + \epsilon_1 \cdot (L_0 + \Delta x)^h$$

$$l_2 = -\Delta x + E + P \cdot (L_0 - \Delta x) + \epsilon_2 \cdot (L_0 - \Delta x)^h$$

wherein, $\Delta x$ is the displacement of the stage (MB) with respect to $x=0$ (for instance $\pm 0.15$)

$E = E_{MF} - E_{ST}$ $E_{MF}$ is the expansion of metrology frame (MF)

$E_{ST}$ is the expansion and of the substrate table (ST)

P is the effect of a global change of the refractive index, per beam length $L_0$ is the nominal beam distance (for instance 0.32, stage at $x=0$, i.e. in the center position)

$\epsilon$ is the effect of a local change of the refractive index, per beam length to power h, and h is the relation between local disturbance and beam length. Empirical experiments indicate for instance 0.5-1.0, typically ~0.7.

It is remarked that the global refractive index coefficient (P) is common for both beams, while the local part is different (expressed by $\epsilon 1$, $\epsilon 2$, which in principle can be the same). Furthermore, the relative expansion of the frame 5 with respect to the substrate table, $E_{MF} - E_{ST}$, is expressed as E. Also, the expansion is neglected in the term behind the global and local "coefficients" P and $\epsilon$.

Thus, with the two interferometers 3, 4 two measurement signals are obtained which are representative for the position of the substrate table 1. When in the calculation device 8 the two measurement signals are subtracted from each other and divided by two the measured length can be written as:

$$X_{meas} \frac{l_1 - l_2}{2} = \Delta x + P \cdot \Delta x + \frac{\epsilon_1 \cdot (L_0 + \Delta x)^h + \epsilon_2 \cdot (L_0 - \Delta x)^h}{2}$$

Thus, it can be concluded that the sensitivity to global changes in the refractive index is reduced from the total beam length to only the displacement length $\Delta x$ of the substrate table. This results in the example for instance from a total beam length of $0.32 \pm 0.15$ to only the stage displacement length $\pm 0.15$, which means at long beam length a reduction of a factor 3. Further, the measurement is completely insensitive for thermal expansion of both the (metrology) frame 5 and the substrate table 1, whereby a uniform expansion on both sides of the substantially symmetrical frame 5 is assumed. This assumption may be made as the frame is for instance typically made of a high conducting material such as aluminum, and generally kept at a uniform temperature.

Since the local change in refractive index is not correlated between both measurements, they may be added quadratic. Furthermore, it may be assumed that the $\epsilon$ in magnitude is equal at 1 and 2; then the measured position may be written as:

$$X_{meas} \frac{l_1 - l_2}{2} = \Delta x + P \cdot \Delta x + \frac{\epsilon}{2} \sqrt{(L_0 + \Delta x)^{2h} + (L_0 - \Delta x)^{2h}}$$

Figure 3:
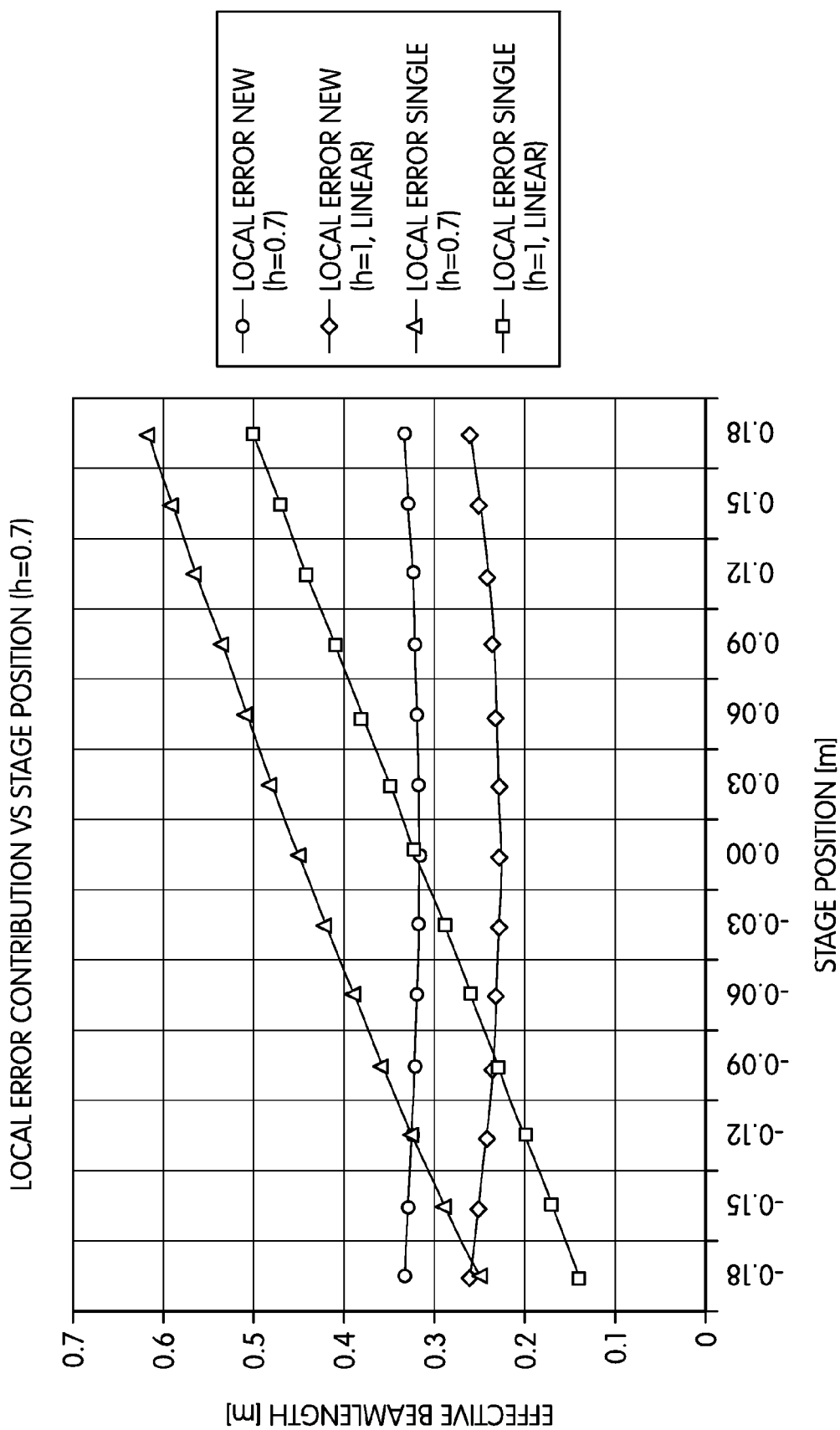
FIG. 3 depicts a first plot of the measurement error against the substrate table position according to prior art and a first embodiment of the invention.

In FIG. 3 the error in the measurement of the effective beam length is plotted against the position of the substrate table for h=0.7 and for h=1 (These values are used as the actual influence will usually lie within this range). It can be seen that due to the averaging of the signals of the two interferometers 3, 4 the error can be substantially decreased for most positions of the substrate table 1. Only in positions of the substrate table 1 close to the interferometer 3, the performance of one single interferometer 3 is better than the performance of a combination of opposed sensors 3, 4 of which the signals are combined by the calculation device 8. This better performance is obtained since the short beam of the interferometer 3 only experiences a small disturbance while the relative long beam of the interferometer 4 experiences a larger disturbance. Thus for these smaller beam lengths it may be preferable to use only the signal of the interferometer 3.

In a further embodiment of the position measuring system the calculation device 8 weighs the signals of the interferometers 3, 4 dependent on the position of the substrate table 1. In such way it is possible to take advantage of the relative short beams in the positions of the substrate table 1 further away from the center position, while the combining of the signals is used optimally for positions close to the center position of the substrate table 1.

The weighted subtraction of the measurement signals of the two interferometers could for instance be written as:

$$X_{meas} = \frac{l_1 - l_2 - a \cdot (l_1 + l_2)}{2}$$

So dependent on a, which is a function of $\Delta x$, it can be written that:

$$X_{meas} = l_1 \quad [a = -1]$$

$$X_{meas} = \frac{l_1 - l_2}{2} \quad [a = 0]$$

$$X_{meas} = l_2 \quad [a = 1]$$

Now substituting l1 and l2 as described above, the measured position calculated by the calculation device 8 may be expressed as:

$$X_{meas} = \Delta x + P \cdot (\Delta x - a \cdot L_0) - a \cdot E + \frac{\varepsilon_1 \cdot (1-a)(L_0 + \Delta x)^h + \varepsilon_2 \cdot (-1-a)(L_0 - \Delta x)^h}{2}$$

If 'a' as function of Δx is chosen:

$$a = \frac{\Delta x}{x_{max}}$$

In which:

$$x_{max} = L_0,$$

the measurement becomes completely insensitive to global changes in refractive index. However, the expansion (E) comes back in the measurement, in particular at further positions of the substrate table 1 (i.e. in position away from the center position). However the error due to the expansion is still reduced in the present example with a factor 2 (0.15/ 0.32). Moreover, the expansion of the frame 5 and substrate table 1 can be controlled by conditioning of the frame and substrate table, which is relative easy when compared to the conditioning of the gas/air through which the signals of the interferometers travel.

Again the local contributions are added quadratic since they are not correlated between the two measurements. This results in a measured position:

$$X_{meas} = \Delta x + P \cdot (\Delta x - a \cdot L_0) - a \cdot E + \frac{\varepsilon}{2}\sqrt{(1-a)^2(L_0 + \Delta x)^{2h} + (-1-a)^2(L_0 - \Delta x)^{2h}}$$

Figure 4:
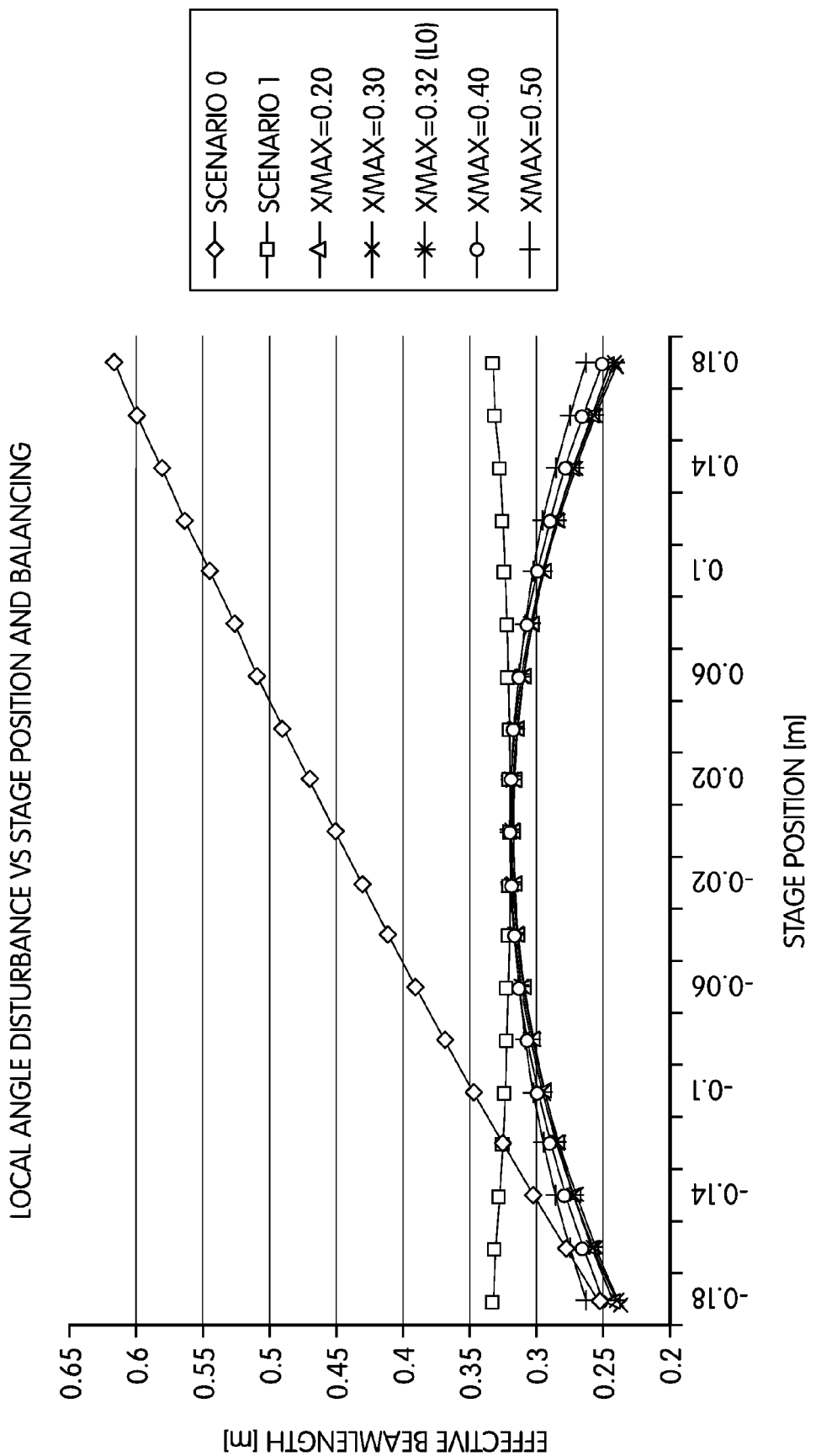
FIG. 4 depicts a second plot of the measurement error against the substrate table position according to prior art and the first and a second embodiment of the invention.

In FIG. 4 the error of the measured position (effective beam length) is plotted against the substrate table position (stage position) measured position. In the figure are plotted the error resulting from using a single interferometer (Scenario 0), using two interferometers with subtracted signals (Scenario 1) and five different scenarios using two interferometers with weighted combined signals, wherein in each scenario a different Xmax is chosen. It can be concluded that when Xmax is chosen to be L0, the reduction of local errors can be up to 0.4 at the old long beam position.

With the weighted difference calculation as described above, the influence of global disturbances of the refractive index is taken away and the influence of local disturbances and expansion is substantially reduced. It will be clear for the man skilled in the art that it is also possible to use other calculation methods and/or weighing factors to calculate the position of the substrate table, whereby the influence of disturbances is substantially reduced.

The calculation device 8 of the position measuring system can further be used to determine the centerline B-B of the lens column as will be explained. The position measuring system may comprise an interferometer to determine the distance between the interferometer and the lens column as a reference length. However, disturbances may occur in the signal for instance caused by global changes in the refractive index. When the calculation device 8 is used to calculate the average of the sum of the signals of the two interferometers 3, 4, which can be determined as:

$$\frac{l_1 + l_2}{2} = E + P \cdot L_0 + \frac{\varepsilon}{2}\sqrt{(L_0 + \Delta x)^{2h} + (L_0 - \Delta x)^{2h}}$$

The effect of local changes of the refractive index in the opposite beams may be regarded as noise and will average to zero. As a result, the sum averaged over time may be written as:

$$\frac{l_1 + l_2}{2} = E + P \cdot L_0$$

Since the sum of the effect of the expansion in the system (expansion of frame 5 minus expansion of substrate table) and the effect of global changes of the refractive index are obtained by this calculation, the measurement of the reference length of the lens column can be corrected with this signal, and therewith the exact position of the centerline of the lens column can be calculated.

It is remarked that in an alternative solution the lens column may regarded as a movable object with respect to the respective interferometer. By arranging interferometers symmetrically on opposite sides of the lens column the effect of global and local changes of the refractive index and the effects of expansion can substantially be reduced. However, this alternative embodiment requires an extra interferometer compared with the embodiment described above.

Figure 5:
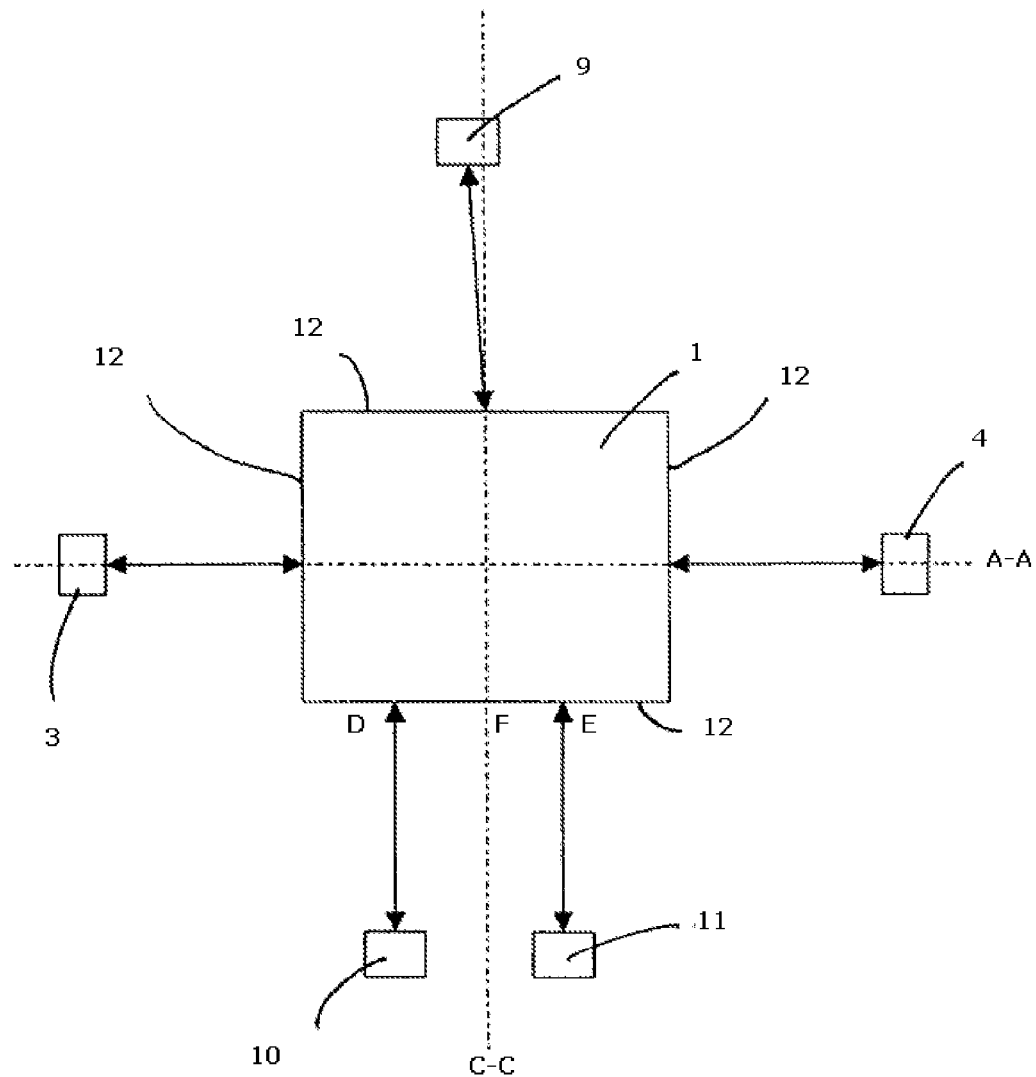
FIG. 5 depicts a second embodiment of a positioning measuring system according to the invention.

In FIG. 5 a top view of the substrate table 1 and the interferometers 3 and 4 is given. It can be seen that the interferometers are substantially located on the measurement line A-A. In practice it may however that these sensors are not exactly located on the measurement line, and that two or more sensors on one side of a substrate table are used to determine the position of the substrate table 1 on the measurement line A-A.

Hereinafter it will be explained how such situation can be taken into account whereby reference is made to further interferometers 9, 10 and 11 configured to measure the position of the substrate table 1 in a second direction. This second direction is in the example perpendicular to the first direction, and the first an second direction may for instance be indicated as x-direction and y-direction, respectively.

The interferometer 9 is located on one further side of the substrate table 1, while the other two interferometers 10, 11 are located on a opposite side of the substrate table. The interferometer 9 and the interferometers 10, 11 are configured to provide a signal which is representative for the distance between the respective interferometer and the substrate table 1. In the calculation device these signals may be used to reduce the effect of global and local changes in the refractive index and the effect of expansion of the frame 5 and/or substrate table 1 as explained for the interferometers 3, 4 in relation with FIG. 2.

However, the beam of the interferometer 9 is not exactly aligned with the measurement line C-C. As a consequence, the signal measured by the interferometer may not correspond with the actual distance between the interferometer 9 and the substrate table 1 measured along the measurement line C-C. By calibration of the position measurement system, the difference between the signal of the interferometer and the actual distance may be determined. This information can be used in the calculation device to calculate the distance on the measurement line C-C on the basis of the signal of the interferometer 9. In this calculation the signal of the interferometer 9 is projected on the measurement line C-C.

On the opposite side of the substrate table. 1, the interferometers 10, 11 are also used to determine the position of the substrate table 1 on the measurement line C-C. Each of the interferometers 10, 11 measures a certain position, D respectively E, of a reflective surface 12 of the substrate table 1. As the location F is known with respect to the measured positions D, E, the position of F can be determined. As a result, the position of the substrate table 1 on the measurement line C-C can be calculated by the calculation device 8 (for instance by interpolation) on the basis of the signals of the two interferometers 10, 11. Such arrangement having two interferometers 10, 11 at one side of the movable object is for instance advantageous since the signals of the two interferometers can also be used to determine the rotation in the plane of the first and the second direction.

Furthermore, the interferometers 10, 11 may be calibrated before or during use so that the exact position of the interferometers and the beams thereof are known and the calculation device 8 can calculate the position of the substrate table on the measurement line C-C on the basis of the signals of the interferometers 10 and 11 on a high accuracy level.

Such calibration may also be performed for the interferometers 3, 4. In the description it was assumed that the interferometers 3, 4 were arranged on the measurement line A-A so that such calibration was not necessary for the calculation of the correct position of the substrate table 1. However, in practice the interferometers will usually be somewhat off-set with respect to the desired measurement line and thus calibration of each of the interferometers will be necessary. The results of the calibration may be used in the calculation device to calculate the signals of the interferometers into values which correspond to values which would be measured if the interferometers would be exactly arranged on the respective measurement line. In such calculation the signal of one or more interferometers is projected on the respective measurement line, i.e. the actual measurement are recalculated into a signal which would be measured by a single interferometer of which the optical signal travels along the respective measurement line.

In the above described embodiments, the position measuring system uses interferometers to determine the position of the substrate table. However, it may be possible that another type of position sensor is used to determine the position of the substrate table, such as for instance certain optical sensors or capacitive sensors. Also the signals of such sensors may be processed in a calculation device to take disturbances in the measurement of the signals into account. In particular such processing may be useful if the performance of the sensors is dependent on the distance between the sensor and the substrate table.

Furthermore, the position measuring system as described in the above embodiments was mainly directed to measure the position of a substrate table. A similar position measuring system may be used to measure the position of another movable object which is used in a lithographic apparatus, such as for instance a patterning device support. It is remarked that objects that move due to expansion with respect to a sensor may be regarded as a movable object within the scope of the present invention. An example of such object may be a lens column as was described in relation to the embodiment shown in FIG. 2.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCD's), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The des criptions above are intended to be illustrative, not limiting. Thus, it will be apparent to one skilled in the art that modifications may be made to the invention as described without departing from the scope of the claims set out below. What is claimed is:

1. A device manufacturing method comprising:
    transferring a pattern from a patterning device onto a substrate, wherein a position of a movable object in a direction is determined by using a position measuring system comprising at least a first sensor arranged spaced from one side of said movable object and at least a second sensor arranged spaced from an opposite side of said movable object;

measuring with said first sensor a first measured distance between said movable object and said first sensor;

measuring with said second sensor a second measured distance between said movable object and said second sensor; and calculating a calculated position of said movable object in said direction on the basis of said first and second measured distances, wherein said calculated position is based on a weighted difference in measured distance between the at least first sensor and the movable object and the at least second sensor and the movable object, respectively.

2. The method of claim 1, wherein said weighted difference is weighted on the basis of the position of said movable object.

3. A device manufacturing method comprising:

transferring a pattern from a patterning device onto a substrate, wherein a position of a movable object in a direction is determined by using a position measuring system comprising at least a first sensor arranged spaced from one side of said movable object and at least a second sensor arranged spaced from an opposite side of said movable object;

measuring with said first sensor a first measured distance between said movable object and said first sensor;

measuring with said second sensor a second measured distance between said movable object and said second sensor; and calculating a calculated position of said movable object in said direction on the basis of said first and second measured distances, wherein signals representative for the position measured on both sides of said movable object are used to determine the expansion of said movable object and/or a frame on which said at least first and second sensors are mounted in order to determine the position of the center of said movable object in said direction.

4. A lithographic apparatus comprising:

a projection system configured to project a patterned radiation beam onto a target portion of a substrate; and a position measuring system configured to determine the position of a movable object in at least one direction, said position measuring system comprising a first sensor being arranged on one side of said movable object and a second sensor being arranged on an opposite side of said movable object, and a calculation device configured to calculate the position of said movable object in said direction on the basis of distances measured by said first sensor and said second sensor, wherein said calculated position is based on a weighted difference in the measured distances provided by the first sensor and the second sensor, respectively.

5. The lithographic apparatus of claim 4, wherein said weighted difference is weighted on the basis of the position of said movable object.

6. The lithographic apparatus of claim 4, wherein the first sensor is arranged spaced from the one side of said movable object and the second sensor is arranged spaced from the opposite side of said movable object, and wherein the weighted difference corresponds to the weighted difference in measured distance between the first sensor and the movable object and the second sensor and the movable object, respectively.

7. The lithographic apparatus of claim 4, wherein said calculation device is configured to calculate each of the measured distances into corresponding distances on a common measurement line.

8. A lithographic apparatus comprising:

a projection system configured to project a patterned radiation beam onto a target portion of a substrate; and a position measuring system configured to determine the position of a movable object in at least one direction, said position measuring system comprising at least a first sensor being arranged spaced from one side of said movable object and at least a second sensor being arranged spaced from an opposite side of said movable object, and a calculation device configured to calculate the position of said movable object in said direction on the basis of distances measured by said first sensor and said second sensor, wherein signals representative for the position measured on both sides of said movable object are used to determine the expansion of said movable object and/or a frame on which said at least first and second sensors are mounted in order to determine the position of the center of said movable object in said direction.

9. The lithographic apparatus of claim 8, wherein said calculation device is configured to calculate each of the measured distances into corresponding distances on a common measurement line.

* * * * *